United States Patent [19]

Thompson

[11] Patent Number: 4,817,106
[45] Date of Patent: Mar. 28, 1989

[54] COUPLED WAVEGUIDE INJECTION LASER

[75] Inventor: George H. B. Thompson, Sawbridgeworth, Great Britain

[73] Assignee: STC PLC, London, England

[21] Appl. No.: 17,527

[22] Filed: Feb. 24, 1987

[30] Foreign Application Priority Data

Mar. 19, 1986 [GB] United Kingdom ............... 8606735

[51] Int. Cl.$^4$ ............................................. H01S 3/19
[52] U.S. Cl. ...................................... 372/50; 372/19; 372/26
[58] Field of Search ...................... 372/19, 26, 44, 46, 372/50

[56] References Cited

U.S. PATENT DOCUMENTS

4,674,096  6/1987  Salzman et al. ...................... 372/50

Primary Examiner—William L. Sikes
Assistant Examiner—B. Randolph Holloway
Attorney, Agent, or Firm—Lee & Smith

[57] ABSTRACT

A coupled waveguide injection laser is provided with two waveguiding ridges (36,37 or 60,61) that are configured such that the coupling between them produces a first order supermode for which a signal current modulation produces optical amplitude modulation with substantially no attendant frequency modulation. In a related structure the configuration affords the facility of providing for the zero order supermode optical frequency modulation with substantially no attendant amplitude modulation.

3 Claims, 6 Drawing Sheets

COUPLED WAVEGUIDE INJECTION LASER

BACKGROUND OF THE INVENTION

In semiconductor lasers and related optical components the carrier injection that is involved typically produces simultaneous changes in both the optical gain and the refractive index of the material. The coupling of the two effects is unfortunate for a variety of applications. In amplitude modulation the index changes cause unwanted frequency chirp. In cw lasers the gain fluctuations that are induced to compensate the noise fluctuations induce index fluctuations which broaden the linewidth. By contrast, in frequency modulators it is the gain change that is unwanted. In more complex situations which involve delayed feedback, or the interaction between master and slave lasers, the coupling of the two effects causes noise and difficulties in synchronisation. Hence a means of overcoming the coupling would be very useful.

The total effect of carriers may be alternatively described as a complex change in permittivity, where gain contributes the imaginary component. The ratio of the real to the imaginary components is equal to the negative of the line broadening factor $\alpha$, which has been variously reported to lie between 2 and 8. A means of rotating the permittivity vector in the complex plane, to make it purely real or imaginary, is therefore desirable.

The permittivity that controls the operation in most optoelectric devices is not the bulk permittivity in the active layer but the effective permittivity of the optical waveguide involved. Changes in the latter are obtained from changes in the former, whether they are real or complex, by multiplication by a confinement factor $\Gamma$, which depends on the waveguide configuration. When $\Gamma$ is real $\alpha$ is unaltered. However, in certain circumstances $\Gamma$ is complex, in which case $\alpha$ is changed.

SUMMARY OF THE INVENTION

It is a general object of the present invention to provide a laser whose construction is such that modulation of its carrier injection produces amplitude modulation of the light output with substantially no frequency modulation, or alternatively a construction providing frequency modulation with substantially no amplitude modulation.

The present invention is particularly concerned with configurations of coupled guides for which the value of $\Gamma$ is a complex number that has the property that the complex value of $\Gamma$ for a particular supermode is such that the change in effective permittivity produced by injected carriers is substantially exclusively imaginary, or, in another instance, substantially exclusively real.

According to the present invention there is provided a coupled waveguide injection laser that includes a terminal for the application thereto of a current for controlling the output of a selected one of the supermodes of the laser, wherein the strength of waveguiding provided by the individual waveguides of the laser at the lasing threshold of said selected supermode and their separation is such that a modulation of the current applied to said terminal modulates the complex propagation constant of said selected supermode by an amount that changes one part of that complex propagation constant while producing substantially no change in the other part, and wherein the laser is configured such that said selected supermode has the lowest threshold of the supermodes of the laser. The current modulation referred to above may result simply from noise or it may be an intentionally provided modulation.

BRIEF DESCRIPTION OF THE DRAWINGS

There follows a more detailed description of theory underlying the invention and a description of lasers embodying the invention in preferred forms. The description refers to the accompanying drawings in which.

DETAILED DESCRIPTION OF PREFERRED EMBODIMENTS

Figure 1:
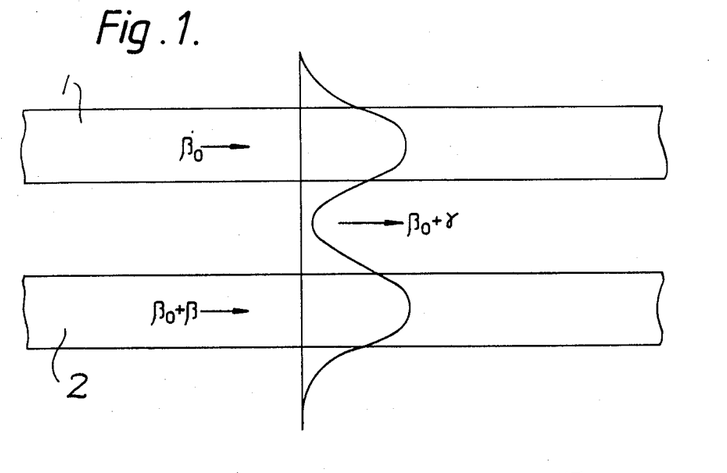
FIG. 1 is a diagram of two coupled waveguides.

In FIG. 1 there is schematically depicted a pair of coupled single mode waveguides 1 and 2. This structure is capable of supporting two supermodes which are distinguishable by the phases and amplitudes of the fields in the two guides. In the zero order supermode the fields are in phase, whereas in the first order supermode they are in antiphase. For simplicity all propagation constants will be normalised to the coupling coefficient 'k' between the two guides. Assuming initially that the two guides are identical, and that $\beta_o$ is the initial normalised propagation constant of each of these guides when entirely uncoupled from its neighbour, investigation may be made of the effect upon the coupled guides of making complex increments to the normalised propagation constant of just one of the guides. If this perturbation takes the form of a complex increment $\beta$ applied to guide 2, the normalised propagation constant of the zero order supermode is $(\beta_o+\gamma)$ where coupled mode theory gives as the approximate relationship between $\beta$ and $\gamma$ the equation:

$$\beta = \gamma - 1/\gamma.$$

Figure 2:
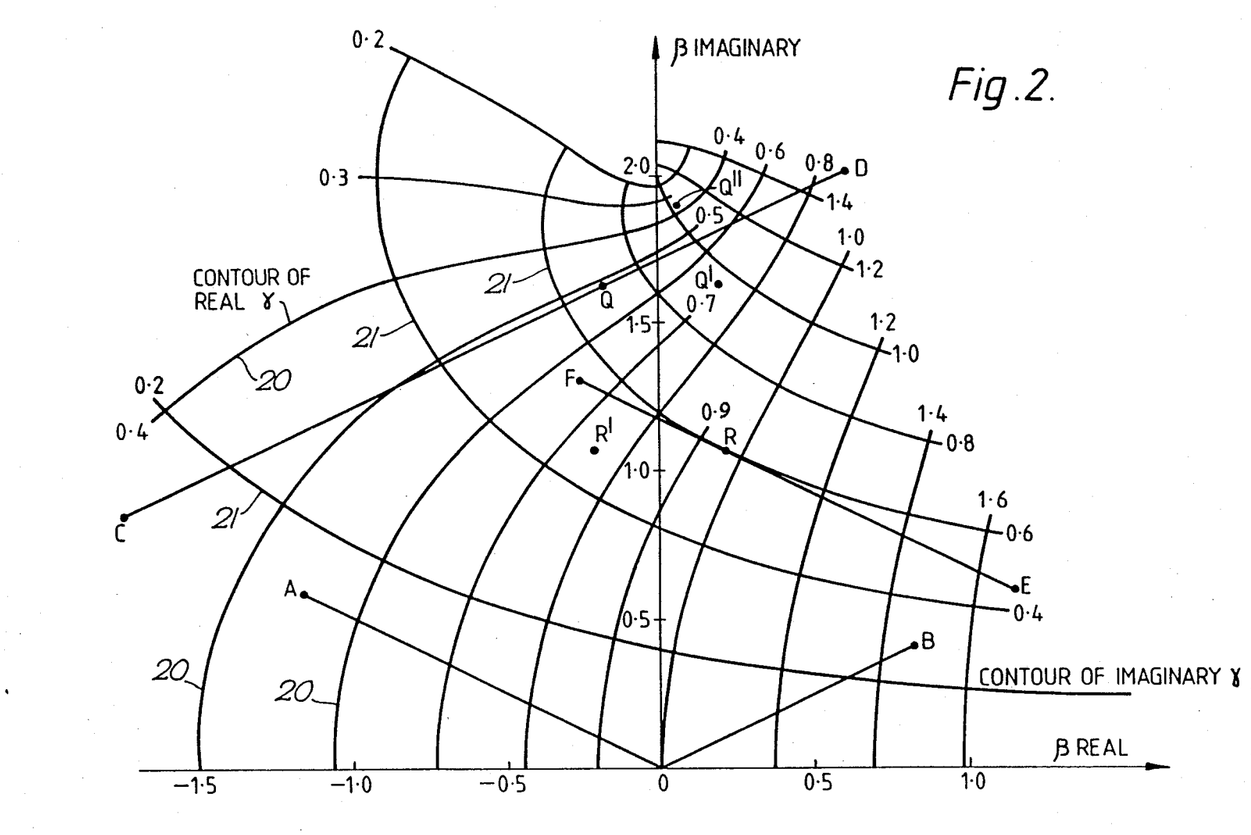
FIG. 2 is a complex plane plot illustrating the effect of perturbation of the normalised propagation constant of one of the waveguides of FIG. 1.

FIG. 2 illustrates this relationship with a plot of contours of real and imaginary values of $\gamma$ on the complex plane of $\beta$. Lines 20 are contours of constant real part of $\gamma$, while lines 21 are contours of constant imaginary part of $\gamma$. This figure applies directly to the zero order supermode situation, but may also be applied to the first order supermode situation by reversing the signs of the real parts of $\beta$ and $\gamma$ (a mirror image in the vertical axis).

At the origin O of the plot of FIG. 2 the real part of $\gamma$ is unity, while the imaginary part is zero. If now a perturbation $\beta$ is applied by the injection of carriers into guide 2, then the resulting change in $\gamma$ will be given by points along a straight line intersecting the origin which has a gradient equal to the ratio of the change in the imaginary part of $\beta$ to the change in the real part, that is a gradient of $-1/\alpha$. Assuming for the sake of example that $\alpha=2$, the value of $\beta$ for the zero order supermode is seen to vary along the line OA. For the case of the first order supermode, the reflection in the vertical axis means that the corresponding variation is along the line OB whose gradient is $1/\alpha$. It will be observed that neither of these lines tracks along a contour of constant real $\gamma$, and thus, for $\alpha=2$, direct modulation of the carrier injection into one side of a laser consisting of a matching pair of coupled waveguides can in no way result in a modulation of the gain of either supermode without resulting in an attendant modulation of the frequency of that supermode. On the other hand there is a region in the neighbourhood of the point Q where contours of real $\gamma$ have a gradient of $1/\alpha$.

Now to be considered is the effect where the perturbation comprises two adjustments to the normalised propagation constant of guide 2. One of these adjustments is a fixed adjustment by the addition of a perturbation $\beta_1$, which is wholly real and has the value of the intercept on the horizontal axis of the straight line CQD of gradient $1/\alpha$. The other adjustment is that produced by carrier injection. Modulation of the carrier injection in this instance moves the operating point along the line CQD. By arranging for the lasing threshold for the first order supermode to occur at point Q by adjusting the coupling coefficient k between the two guides, modulation of the injected carriers is arranged to produce a modulation of the gain with substantially no attendant modulation of the frequency.

The equivalent operating point of the zero order supermode is given by the point Q', which is the reflection of Q in the vertical axis. It will be noted that imaginary part of $\gamma$ for Q' is larger than that for Q. Hence the structure will require some form of additional means for discriminating against excitation of the zero order supermode to allow preferential excitation of the first order one.

The need for such discrimination can be avoided by choosing to operate at some point such as the point Q''. This is another point at which the contours of real $\gamma$ have a gradient of $1/\alpha$, but in this instance the reflection in the vertical axis corresponds to a point of smaller, not larger, imaginary $\gamma$. One disadvantage however of operating at a point such as this is that it is in a region where the twist is much stronger, and hence the operating point has to be found with a much higher degree of precision and the dynamic range is correspondingly more limited.

The corresponding requirement for finding an operation point for which carrier injection modulation will induce no change in gain is to find a point, such as the point R, where contours of imaginary $\gamma$ have a gradient of $-1/\alpha$. In this instance modulation of the injected carriers will cause the operating point of the zero order mode to move along the straight line ERF of gradient $-1/\alpha$.

Figure 3:
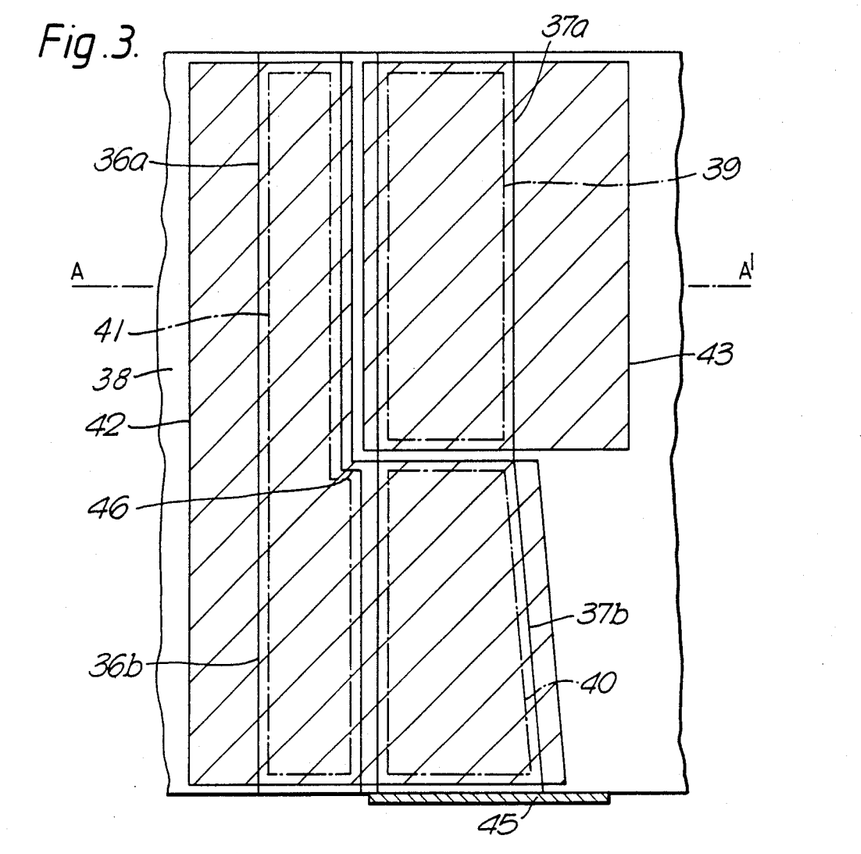
FIG. 3 is a schematic representation of a laser designed to be capable of having its optical output amplitude modulated with substantially no attendant frequency modulation.
Figure 4:
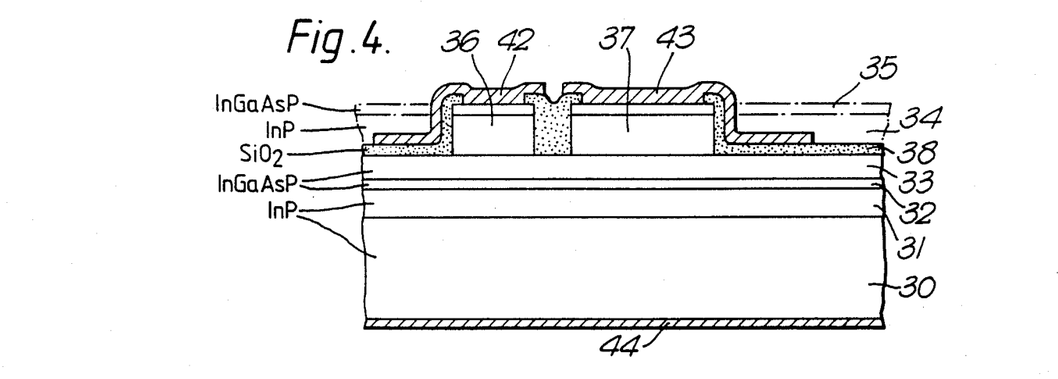
FIG. 4 is a cross-section of the laser of FIG. 3 on the line A—A'.

For the description of an example of a coupled waveguide injection laser designed to provide a first order supermode that can be amplitude modulated with substantially no attendant frequency modulation reference is now directed to FIGS. 3 and 4. The semiconductive material of the laser of these figures consists of an indium phosphide substrate 30 upon which five epitaxial layers are grown. These comprise an indium phosphide layer 31 underlying an active layer 32 of quaternary ($In_{1-x}Ga_xAs_yP_{1-y}$) material, a waveguide layer 33 overlying the active layer, also of quaternary material but of lower refractive index than the active layer, a further layer 34 of indium phosphide, and a capping layer 35 of quaternary material provided for facilitating the making of good electrical contact with the indium phosphide of layer 34. The substrate 30, and the indium phosphide layer 31 that is directly grown on it, are of one conductivity type, typically n-type, while the layers above the active layer are of the opposite conductivity type. The relative refractive indices of the sequence of layers provide a waveguiding effect in the direction normal to the plane of the layers, while a corresponding waveguiding effect in the lateral direction is provided by two ridges 36 and 37 which are formed by selective etching of layers 34 and 35. The ridged surface is next covered with a silicon passivation layer 38 through which three windows 39, 40 and 41 are etched. Metallisation is then provided to form a bias electrode 42 and modulation electrode 43 and a counter electrode 44.

Each ridge 36 and 37 has two parts 36a and 36b, and 37a and 37b, which perform different functions. The shape and spacing of parts 36a and 37a is chosen having regard to the coupling requirement to achieve at lasing threshold for the first order supermode an operating condition corresponding to the locality of the point Q of FIG. 2. The shape and spacing of parts 36b and 37b are concerned with coupling out the power in a manner that will allow an antireflection coating 45, which covers only that portion of the active layer underlying the end of ridge 37, to function as a supermode discrimination device providing for that end facet a low reflectivity for the zero order supermode while at the same time providing a high reflectivity for the first order one. The ridges are parallel-sided in parts 36a and 37a, and part 36b is also parallel sided, but part 37b is tapered outwardly toward the end facet with the antireflection coating. At this facet the width of ridge 37 is sufficiently larger than that of ridge 36 for substantially all the intensity associated with the zero order supermode to lie under ridge 37, while substantially all that associated with the first order supermode lies under ridge 36. In these circumstances the antireflection coating 45 is effective in suppressing reflection of the zero order supermode, but has substantially no effect upon the first order supermode.

Current injected through the bias electrode 42 is adjusted to a level to render approximately transparent those portions of the waveguides underlying it. Current injected through the modulation electrode 43 is at a significantly higher current density that induces stimulated emission sufficient to produce lasing. The difference in current density in ridge 37 between the part covered by the bias electrode 42 and that covered by the modulation electrode 43 produces a corresponding step in propagation constant if there is no compensating change in any other physical parameter at this point. One way of avoiding mismatch problems in the coupled waveguide structure is to introduce a compensating change in the propagation constant by means of a step 46 in the width of ridge 36.

One way of arriving at a particular design of laser structure as depicted in FIGS. 3 and 4 is to choose an appropriate lasing length over which stimulated emission is to occur. This length is determined by the choice of length for the portion 37a of the ridge 37. This in turn, having regard to the effective reflection coefficients of the end facets, determine the value of amplitude gain 'g' ($cm^{-1}$) at which the lasing threshold is reached. The required coupling coefficient 'k' between the two guides is equal to the value 'g' divided by the value of imaginary $\gamma$ selected from the plot of FIG. 2. Thus, for an operating point Q, the coupling coefficient is equal to $g/0.7$ $cm^{-1}$. Once the value of the coupling coefficient has been determined, it is a straight-forward matter to design a symmetrical twin-ridge coupled laser with the requisite coupling. This design is then modified to provide the requisite amount of unbalance to produce a change of $k\beta_1$ in propagation constant.

Attention is now directed to the coupled waveguide injection laser of FIGS. 5, 6, 7 and 8 which is another design formulated to provide a first order supermode that can be amplitude modulated with substantially no attendant frequency modulation. This is distinguished from the design of the laser of FIGS. 3 and 4 primarily by the fact that the bias current is not applied to any part of the ridge to which the modulation current is applied, and by the fact that its application to the other ridge is confined to that region directly opposite the region to which the modulation current is applied. The amount of bias current that is required is thus significantly less. The spontaneous emission associated with this bias current is therefore also less, and for certain applications the advantage of reduced noise more than offsets any penalties associated with the increased complexity of the structure.

The basic structure of the laser of FIGS. 5, 6, 7 and 8 is that of a laser with Bragg distributed reflectors. In this instance an n-type indium phosphide substrate 50 is provided with four epitaxial layers comprising an n-type indium phosphide layer 51, an n-type waveguide layer 52 of quaternary material, an undoped active layer 53 also of quaternary material but of higher refractive index than the waveguide layer, and a protective p-type indium phosphide layer 54. These three epitaxial layers are left intact over a central region of the laser, but at each end selective etching is employed to remove layers 54 and 53 to expose the upper surface of the waveguide layer 52. The exposed regions of this waveguide layer are next patterned to form distributed Bragg reflectors 55 and 56. Then three further epitaxial layers are grown comprising a p-type quaternary layer 57 of refractive index lower or equal to that of the waveguide layer 52, a p-type indium phosphide layer 58 and finally a p-type capping layer 59 of quaternary material. The primary function of the quaternary layer 57 is to space the waveguide layer 52 from the indium phosphide of layer 58 and so provide a better match between the optical energy distribution of light propagating in the region where the active layer still remains and that propagating in the end regions from where the active layer 53 and its covering layer 54 of indium phosphide have been replaced. Two ridges 60 and 61 are formed by selective etching of the layers 59 and 58, and also optionally layer 57 in the regions where it directly overlies layer 54 rather than layer 52. The ridged surface is next covered with a silica passivation layer 62 through which two windows 63 and 64 are etched prior to the deposition of metallisation to form a bias electrode 65, a modulation electrode 66, and a counter electrode 67.

Each ridge 60 and 61 has three distinct parts 60a, 60b and 60c, and 61a, 61b and 61c. The middle parts 60b and 61b register with the middle section of the laser where the active layer has not been removed. The end part 61c is tapered for the same reason as the corresponding part 37b of the ridge 37 of the laser of FIGS. 5 and 6, namely to achieve the physical separation of the power of the zero and first order supermodes. Between portions 60b and 60c of ridge 60 there is a step 67 in width whose function is the same as that of step 46 in ridge 36 of the laser of FIGS. 5 and 6. A similar step 68 between portions 61a and 61b of ridge 61 performs a similar function at the other end of the central region.

The distributed Bragg reflector 55 is designed to provide high reflectivity for both supermodes and so is of conventional construction. In contrast, distributed Bragg reflector 55 must be designed to provide high reflectivity for the first order mode, whose power at the end of the device is concentrated under rib ridge 60, while providing low reflectivity for the zero order mode whose power at the end of the device is concentrated under ridge 61. One way of achieving this object is to provide the Bragg reflecting profile only under ridge 60 and to space it sufficiently far from the active region for substantially all the zero order power to have been coupled out of the region under ridge 60 before the region of the Bragg reflecting profile has been reached. A slightly shorter structure is possible however if the Bragg reflector is arranged to start somewhat closer to the middle section of the laser and has its initial patterning extending not only under ridge 60 but also under ridge 61. The two ends of the laser are provided with antireflection coatings 69 and 70 so that the reflection properties defined by the Bragg profiles are not disrupted by spurious Fresnel reflections. In a modified version of this laser either one or both of the distributed Bragg reflectors are dispensed with together with their antireflection coatings, so that the requisite feedback is instead provided by Fresnel reflection. If distributed Bragg reflector 56 is dispensed with, part of antireflection coating 70 will be retained in order to suppress reflection in the region underlying ridge 61. If distributed Bragg reflector 55 is dispensed with, coating 69 may be dispensed with, or converted into a reflective coating to maximise the light emission from the opposite end of the laser.

Figure 9:
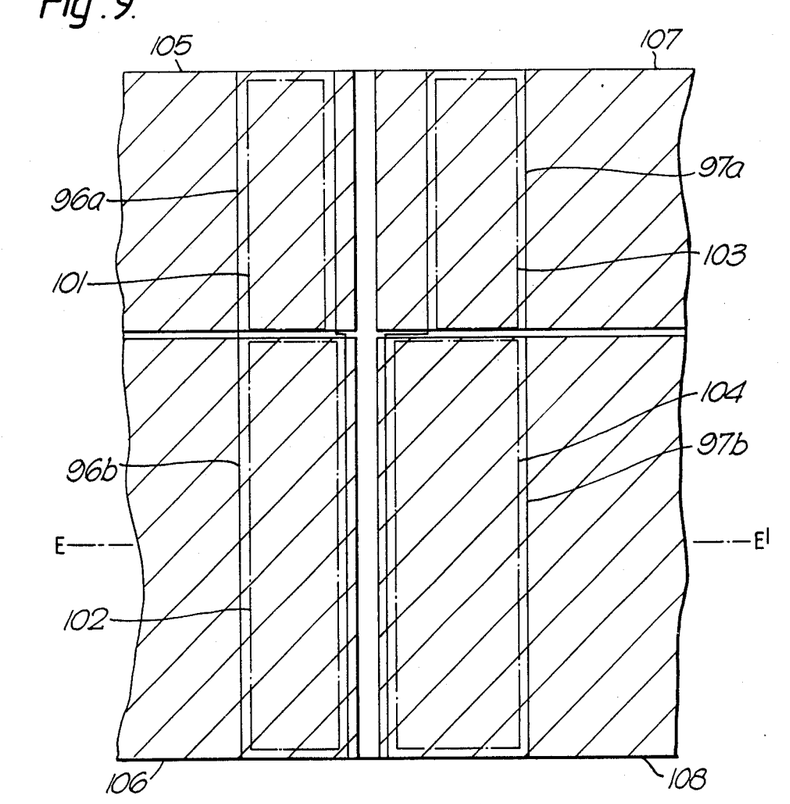
FIG. 9 is a schematic representation of a laser designed to be capable of having its optical output frequency modulated with substantially no attendant amplitude modulation.
Figure 10:
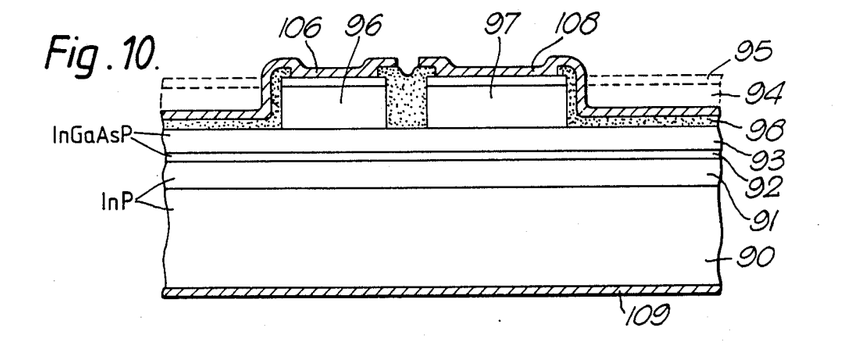
FIG. 10 is a cross-section of the laser of FIG. 9 on the line E—E'.

Attention will now be turned from devices where current modulation produces amplitude modulation of the optical output to a device for which current modulation results in frequency modulation of the optical output. This device is depicted in FIGS. 9 and 10. Referring first however, to FIG. 2, it will be noticed that if matters are arranged such that current modulation shifts the operating point along the straight line ERF, and if further it is arranged that the lasing threshold is given by the point R, where the line ERF is tangent to a curve of constant imaginary $\gamma$, then an increase in current drive taking the device to an operating point above R results in a move to a region of smaller imaginary $\gamma$. This is an unstable condition because the reduced gain extinguishes the lasing operation, and this results in an increase in carrier density, which in turn shifts the operating point even further above R. In the laser of FIGS. 9 and 10 this instability problem is overcome by arranging for the portion of the device providing the ERF operating characteristic to be in tandem with another compensating portion for which the coupling constant is sufficiently greater for it to possess the conventional type of characteristic in which increasing carrier concentration produces increasing gain (larger imaginary γ).

The laser of FIGS. 9 and 10 has the same arrangement of epitaxial layers as the laser of FIGS. 3 and 4. The semiconductive material of this laser thus consists of an indium phosphide substrate 90 upon which five epitaxial layers are grown. These comprise an indium phosphide layer 91 underlying an active layer 92 of quaternary material, a waveguide layer 93 overlying the active layer, also of quaternary material but of lower refractive index than the active layer, a further layer 94 of indium phosphide, and a capping layer 95 of quaternary material provided for facilitating the making of good electrical contact with the indium phosphide of layer 94. Two ridges 96 and 97 are formed by selective etching of layers 94 and 95. The ridged surface is next covered with a silica passivation layer 98 through which four windows 101 to 104 are etched. Metallisation is then provided to form four electrodes 105 to 108, and a counter electrode 109.

Each ridge 96 and 97 is composed of two distinct portions 96a and 96b, and 97a and 97b. Portions 96a and 97a co-operate to form a relatively weakly coupled pair of waveguides with dimensions chosen to form an operating characteristic for the zero order supermode given by the line ERF on FIG. 2 when the current injected through electrode 107 is modulated, while that injected through electrode 105 is at a level maintaining substantial transparency in that portion of the waveguide underlying portion 96a. Portions 96b and 97b co-operate to form a more strongly coupled pair of waveguides for which the zero order supermode operating characteristic exhibits the conventional behaviour of providing increasing gain for increasing drive current applied to electrodes 106 and 108. Portions 96b and 97b are also dimensioned such that the zero order supermode field profile underlying these portions is spatially well matched with the corresponding zero order supermode field profile underlying portions 96a and 97a. No additional discrimination against the first order mode is in that instance required because the corresponding operating point R' of the first order order supermode, given by the reflection of R in the vertical axis is in a region of lower gain (smaller imaginary γ).

Figure 11:
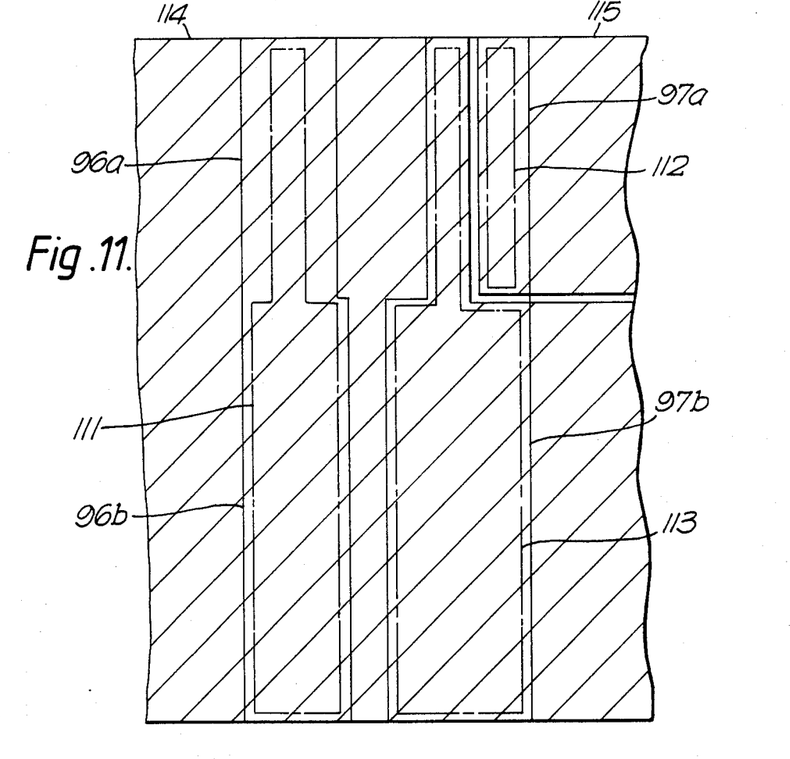
FIG. 11 is a representation of a modified form of the laser of FIG. 9.

FIG. 11 depicts a modified version of the laser of FIGS. 9 and 10 in which the arrangement of windows in the silica passivation layer 98 has been changed in order to reduce from four to two the number of separate electrodes required. In this construction the passivation layer is provided with three windows 111, 112 and 113, and metallisation is then provided to form a bias electrode 114, a modulation electrode 115, and a counter electrode 116. The relative widths of the different regions of windows 111 and 113 are chosen so that when current is injected into the bias electrode 114 to produce stimulated emission in the portions of the waveguides underlying portions 96b and 97b of the ridges 96 and 97, this current also provides sufficient injection into the portions 96a and 97a to bring the underlying portions of the waveguides substantially to threshold. In these circumstances the modulating current applied to electrode 115 is not required to have a current pedestal. In a further modification (not illustrated) the window 113 does not extend to portion 97a of rib 97 in which case the current injected into the modulation electrode will require a current pedestal.

Figure 5:
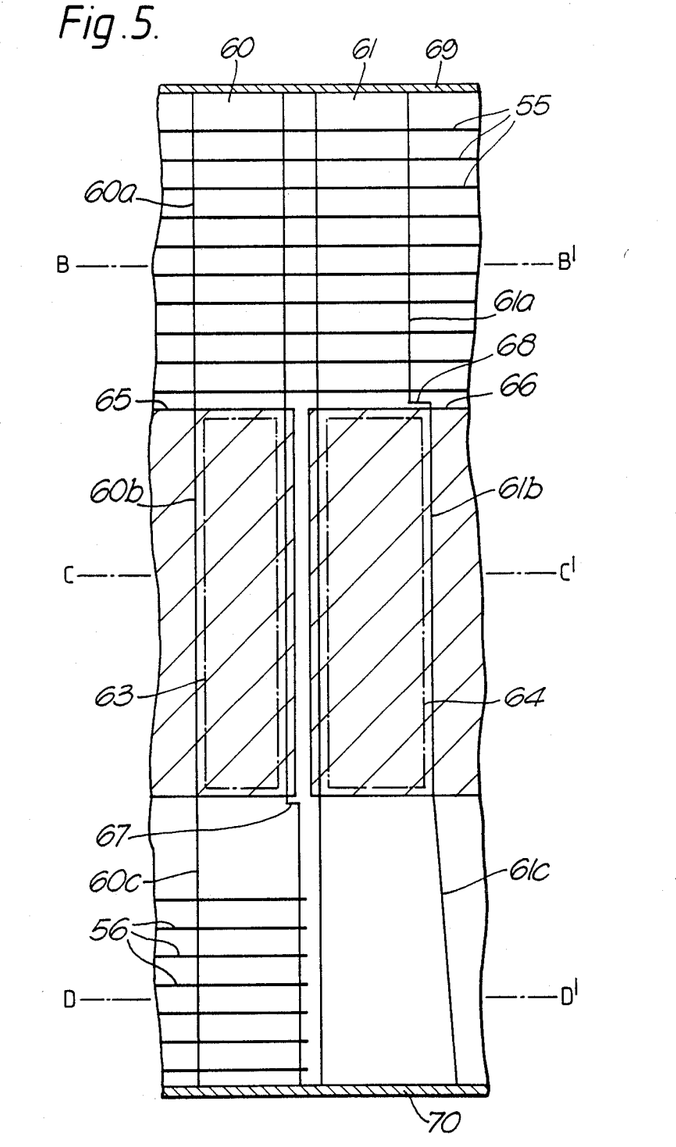
FIG. 5 is a schematic representation of an alternative design of laser having similar properties to that of FIGS. 3 and 4, FIGS. 6, 7 and 8 are cross-sections of the laser of FIG. 5 respectively on the line B—B', C—C', and D—D'.
Figure 6:
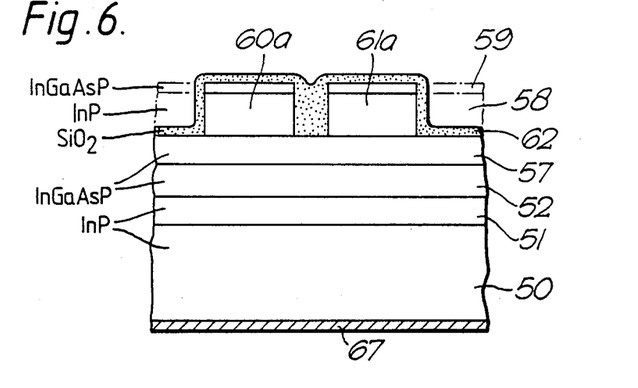
Figure 7:
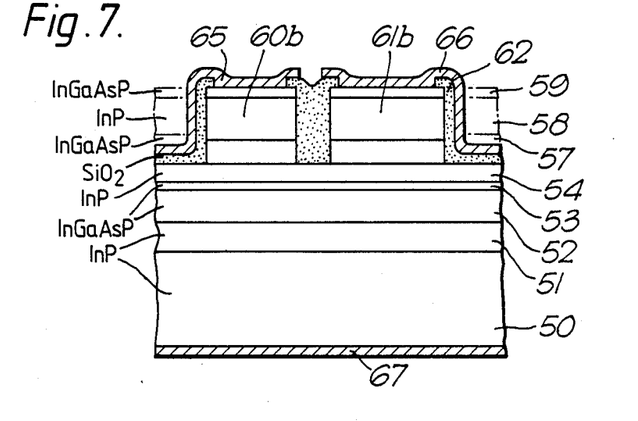
Figure 8:
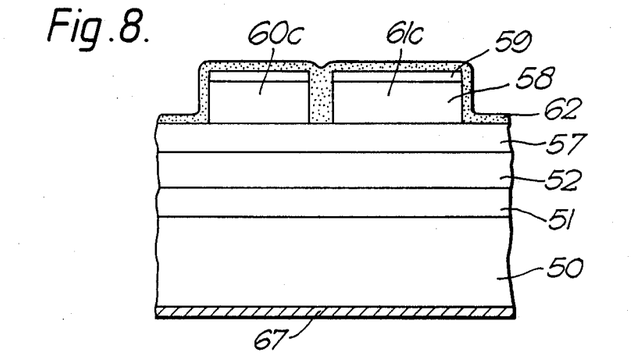

The lasers of FIGS. 4 and 5 may also be used as optical amplifiers if operated below threshold. They will have the advantage over prior art lasers that their wavelength tuning is not affected by the strength of the input signal, and hence that their dynamic range is greater. Optical inputs are preferably applied under ridges 36b or 60c and outputs extracted at the opposite end.

I claim:

1. A monolithic injection laser array having a semiconductor body provided with a plurality of laser cavities, wherein each one of the constituent members of said plurality of laser cavities is constituted by an optical waveguide provided with optical feedback, wherein said constituent members are laterally coupled to provide a set of supermodes for said laser array, wherein said body has an outer surface and includes a plurality of electrodes for the application to said laser array of a current for controlling the output of the member of said set of supermodes which has the lowest lasing threshold, wherein at least one of said waveguides has a cross-sectional profile that is not identical with the cross-sectional profile of at least one other of said waveguides, providing said at least one waveguide with a propagation constant that is different from that of said at least one other of said waveguides, wherein said at least one and said at least one other waveguides are spaced such that a modulation of said current applied to said electrodes modulates the complex propagation constant of said lowest lasing threshold supermode, which complex propagation constant consists of a real part and an imaginary part, by an amount that changes one of said parts of said complex propagation constant while producing substantially no change in the other of said parts.

2. A laser array as claimed in claim 1, wherein the spacing of said at least one of the waveguides from said at least one other of said waveguides in relation to said difference between their propagation constants is such that said current modulation modulates the real part of the complex propagation constant of said lowest threshold supermode.

3. A laser array as claimed in claim 1, wherein the spacing of said at least one of the waveguides from said at least one other of said waveguides in relation to said difference between their propagation constants is such that said current modulation modulates the imaginary part of the complex propagation constant of said lowest threshold supermode.

* * * * *